US007329548B2

(12) United States Patent
Li et al.

(10) Patent No.: US 7,329,548 B2
(45) Date of Patent: Feb. 12, 2008

(54) INTEGRATION PROCESSES FOR FABRICATING A CONDUCTIVE METAL OXIDE GATE FERROELECTRIC MEMORY TRANSISTOR

(75) Inventors: Tingkai Li, Vancouver, WA (US); Sheng Teng Hsu, Camas, WA (US); Bruce D. Ulrich, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 228 days.

(21) Appl. No.: 11/215,521

(22) Filed: Aug. 30, 2005

(65) Prior Publication Data

US 2008/0003697 A1 Jan. 3, 2008

(51) Int. Cl.
*H01L 21/00* (2006.01)
*H01L 21/338* (2006.01)
*H01L 21/8242* (2006.01)

(52) U.S. Cl. .......................... 438/3; 438/182; 438/183; 438/253; 257/E21.009; 257/E21.011; 257/E21.208; 257/E21.436; 257/E21.664

(58) Field of Classification Search .................... 438/3, 438/182, 183, 253; 257/E21.009, E21.011, 257/E21.208, E21.209, E21.436, E21.664
See application file for complete search history.

(56) References Cited

U.S. PATENT DOCUMENTS 6,335,550 B1 * 1/2002 Miyoshi et al. ............. 257/295
6,359,295 B2 * 3/2002 Lee et al. ................... 257/295
6,541,281 B2 * 4/2003 Ramesh ......................... 438/3
6,642,563 B2 * 11/2003 Kanaya ...................... 257/296
7,008,833 B2 3/2006 Li et al.
2005/0054166 A1 3/2005 Hsu et al.

OTHER PUBLICATIONS

Tingkai Ii et al., "Conductive Metal Oxide Thin Film Ferroelectric Memory Transistor", May 21, 2004, Integrated Ferroelectrics, v67; pp. 235-243.*

* cited by examiner

*Primary Examiner*—Michael Lebentritt
*Assistant Examiner*—Ron Pompey
(74) *Attorney, Agent, or Firm*—Robert D. Varitz; Sharp Laboratories of America, Inc.

(57) ABSTRACT

A method of fabricating a conductive metal oxide gate ferroelectric memory transistor includes forming an oxide layer a substrate and removing the oxide layer in a gate area; depositing a conductive metal oxide layer on the oxide layer and on the exposed gate area; depositing a titanium layer on the metal oxide layer; patterning and etching the titanium layer and the metal oxide layer to remove the titanium layer and the metal oxide layer from the substrate except in the gate area; depositing, patterning and etching an oxide layer to form a gate trench; depositing and etching a barrier insulator layer to form a sidewall barrier in the gate trench; removing the titanium layer from the gate area; depositing, smoothing and annealing a ferroelectric layer in the gate trench; depositing, patterning and etching a top electrode; and completing the conductive metal oxide gate ferroelectric memory transistor.

18 Claims, 7 Drawing Sheets

10
14
PREPARE SUBSTRATE
20
FORM OXIDE LAYER ON SUBSTRATE
24
REMOVE OXIDE IN GATE AREA
30
DEPOSIT INDIUM OXIDE LAYER
34
DEPOSIT TITANIUM LAYER
70
OPTIONALLY, DEPOSIT, PATTERN AND ETCH BOTTOM ELECTRODE
36
PATTERN AND ETCH INDIUM OXIDE AND TITANIUM LAYERS
40
DEPOSIT, PATTERN AND ETCH OXIDE LAYER
44
DEPOSIT AND ETCH BARRIER INSULATOR LAYER TO FORM SIDEWALL BARRIER
TO Fig. 1B

FROM Fig. 1A
48
ETCH TITANIUM LAYER
50
DEPOSIT, SMOOTH AND ANNEAL FERROELECTRIC LAYER
56
DEPOSIT TOP ELECTRODE
58
PATTERN AND ETCH TOP ELECTRODE
66
COMPLETE DEVICE 20
16
18
12

32
28
20
16
26
18
12

INTEGRATION PROCESSES FOR FABRICATING A CONDUCTIVE METAL OXIDE GATE FERROELECTRIC MEMORY TRANSISTOR

FIELD OF THE INVENTION

This invention relates to ferroelectric non-volatile memory and integration processes, and specifically to fabrication processes for fabricating a gate oxide using conductive metal oxide in a MFMox memory device.

BACKGROUND OF THE INVENTION

We have previously disclosed a method of fabricating a metal/ferroelectric/metal (MFM) gate stack on a semiconductive metal oxide on a silicon structure, $In_2O_3$ thin films resistivity control by doping metal oxide insulator for MFMox device applications, U.S. patent application Ser. No. 10/755,419, filed Jan. 12, 2004, and of fabricating a MFM gate stack on semiconductive metal oxide on silicon substrate structure, Conductive metal oxide gate ferroelectric memory transistor, U.S. Patent Publication No. 2005/0054166 A1 of Hsu et al., published Mar. 10, 2005. These two device structures, however, do not have floating gate structures, which structures result in a potentially long memory retention time. The integration processes for fabricating metal oxide ferroelectric memory transistors require precise fabrication procedures, particularly in the deposition and annealing steps during fabrication of a semiconductive metal oxide on a silicon substrate, and in ferroelectric thin film deposition and annealing processes. By optimizing the integration processes, a working 1T MFMox memory device is efficiently fabricated.

SUMMARY OF THE INVENTION

A method of fabricating a conductive metal oxide gate ferroelectric memory transistor includes forming an oxide layer a substrate and removing the oxide layer in a gate area; depositing a conductive metal oxide layer on the oxide layer and on the exposed gate area; depositing a titanium layer on the metal oxide layer; patterning and etching the titanium layer and the metal oxide layer to remove the titanium layer and the metal oxide layer from the substrate except in the gate area; depositing, patterning and etching an oxide layer to form a gate trench; depositing and etching a barrier insulator layer to form a sidewall barrier in the gate trench; removing the titanium layer from the gate area; depositing, smoothing and annealing a ferroelectric layer in the gate trench; depositing, patterning and etching a top electrode; and completing the conductive metal oxide gate ferroelectric memory transistor.

It is an object of the invention to provide optimum integration processes for conductive metal oxides as gate oxides for MFMox memory devices.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

A one-transistor, metal-ferroelectric-metal oxide (1T MFMox) structure constructed according to the method of the invention has a top electrode and a ferroelectric layer(s), which forms a gate stack, and may or may not have a bottom electrode. When present, a bottom electrode is formed of a thin layer of metal, such as Ir, Pt, Rh, Ti, TiN, Ta, TaN, or multi-layer structures of these metals, which are typically deposited by a sputtering process. The metal oxide is a semiconductive metal oxide, such as $In_2O_3$, indium tin oxide (ITO), $RuO_2$ $La_{1-x}Sr_xCoO_3$, etc, and functions as a conductive channel. Because the conductive channel of the device is formed of a metal oxide, crystalline silicon is not required, and a device fabricated according to the method of the invention may be fabricated after all other associated IC circuit fabrication, which renders the method of the invention suitable for 3D memory circuit fabrication.

Figure 1A:
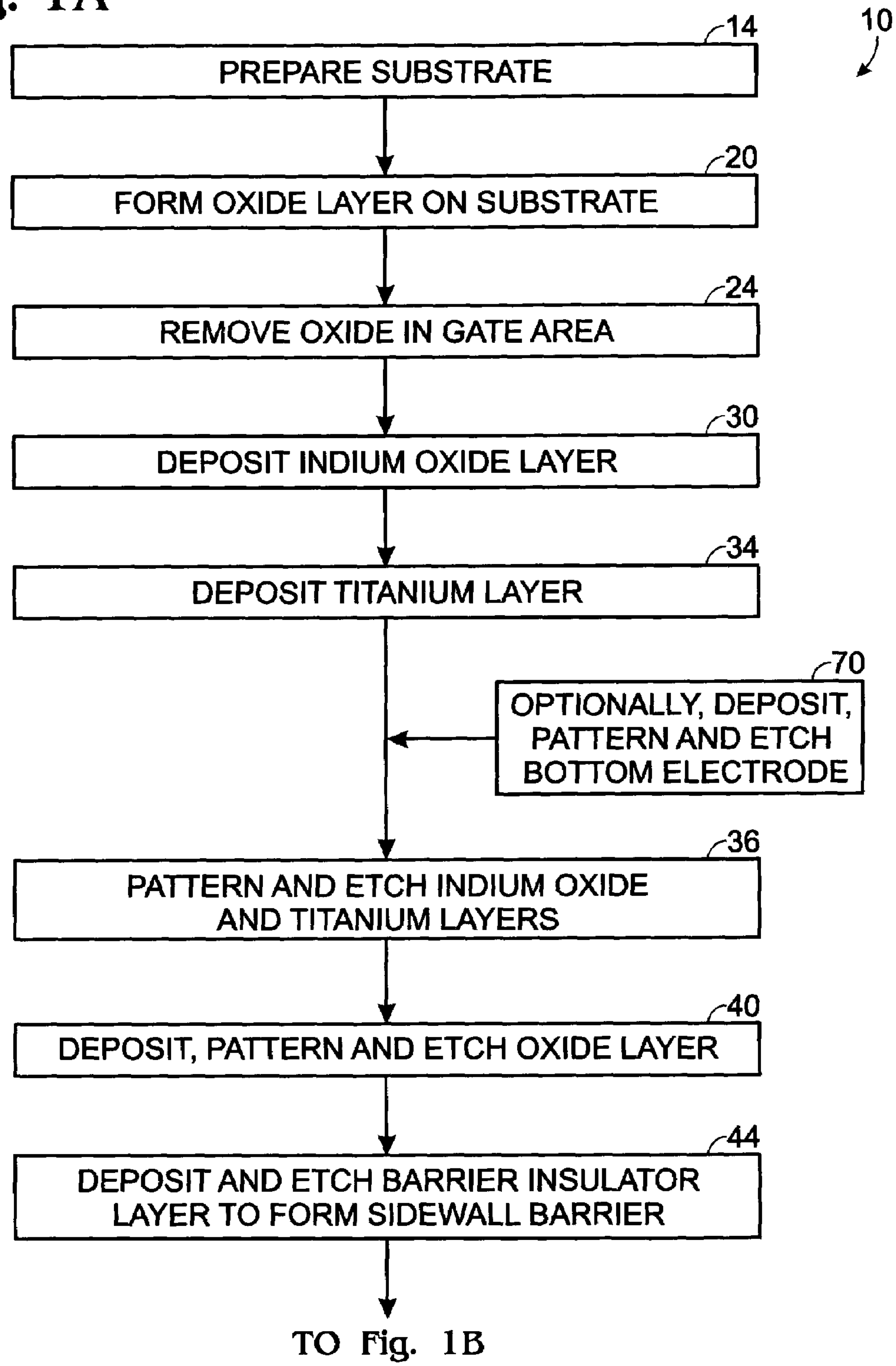
FIG. 1 is a block diagram of the method of the invention.
Figure 1B:
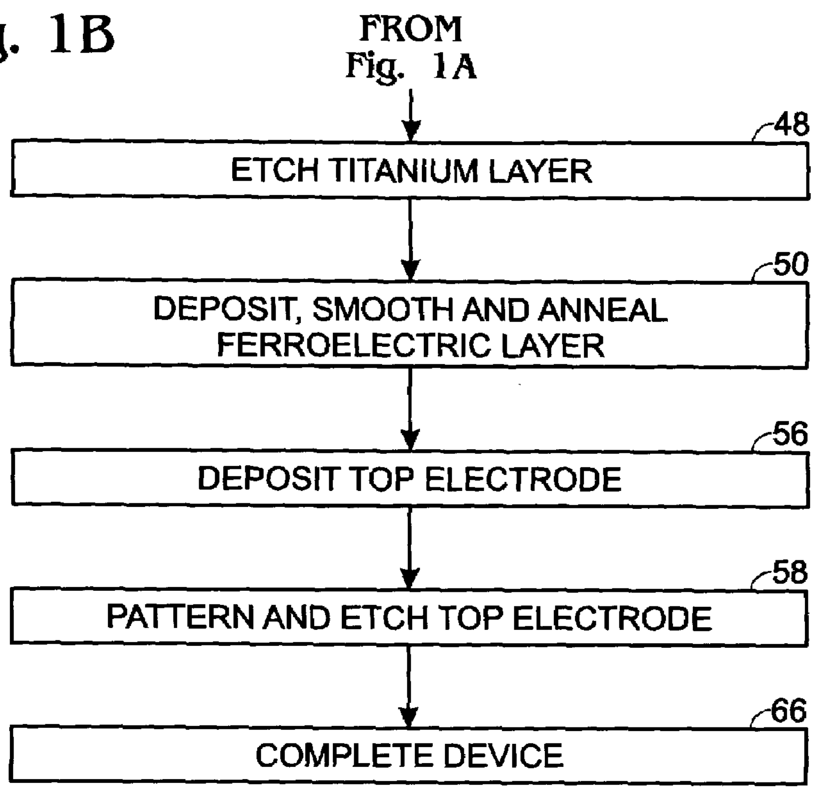
Figure 2:
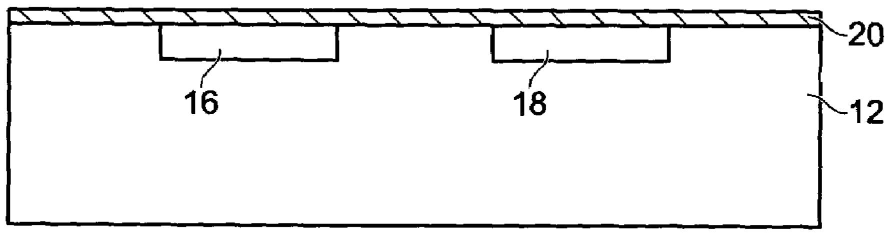
FIGS. 2-6 depict steps in fabrication of a device according to the method of the invention.

Referring now to FIGS. 1 and 2, the first embodiment of a device constructed according to the method of the invention 10 is described as a 1T MFMox without a bottom electrode, using conventional state-of-the-art techniques to fabricate P-wells and N-wells, to provide device isolation, to adjust the voltage threshold and to form CMOS supporting devices on a substrate 12, referred to herein as preparation of the substrate 14. A source junction 16 and a drain junction 18 of a memory transistor is fabricated at the same time as the source/drain for standard CMOS transistors. A layer of oxide 20 is formed 22 on substrate 14 to a thickness, in the preferred embodiment, of about 50 nm.

Figure 3:
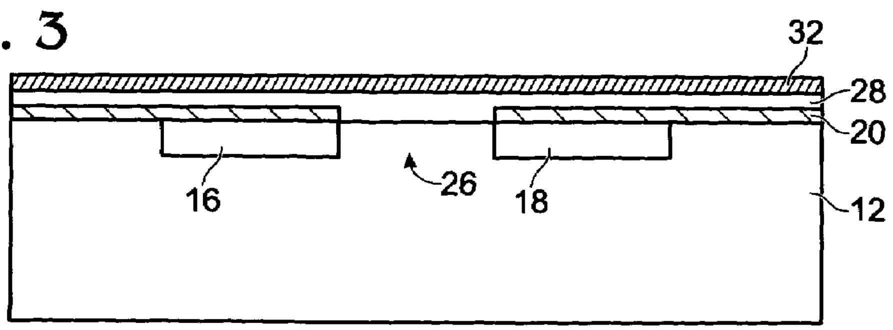

As shown in FIG. 3, oxide 20 on a memory area is removed 24, by a wet etch process, in a gate area 26. A layer 28 of indium oxide ($In_yO_x$) is deposited 30, at optimum process conditions, and annealed at between about 400° C. to 800° C. for between about 5 minutes to 60 minutes, depending on the requirements of the transistor devices to be fabricated. Other semiconductive metal oxides, such as ITO, $RuO_2$ $La_{1-x}Sr_xCoO_3$, etc, may be used in fabrication of the memory transistor according to the method of the invention.

A layer of titanium 32 is deposited 34 to a thickness of between about 5 nm to 50 nm.

Figure 4:
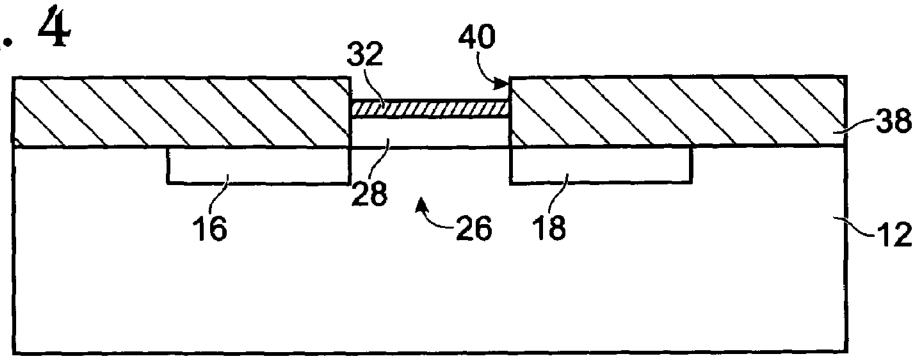

Referring now to FIG. 4, titanium layer 32 and indium oxide layer 28 are patterned and etched 36, stopping at the level of $SiO_2$ layer, or the silicon substrate, to remove all metal oxide, except on memory gate area 26. About 400 nm of $SiO_2$ 38 is deposited, patterned and etched 40 at gate area 26, stopping at the level of titanium layer 32. This provides a gate trench 42 for selective ferroelectric material deposition.

Figure 5:
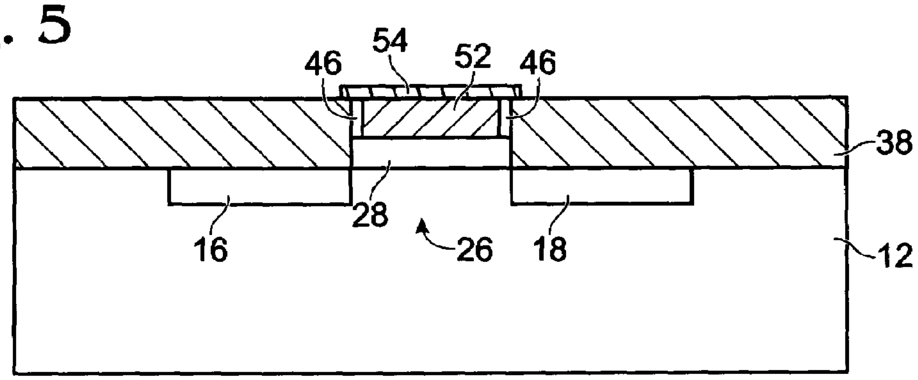

Turning now to FIG. 5, between about 20 nm to 70 nm of barrier insulator, such as $SiN_x$ or $AlO_x$, is deposited and plasma etched 44 to form a sidewall barrier 46 in gate trench 42. A wet etch step 48 of titanium layer 32 stops at the level of indium oxide layer 28, which is followed by selective deposition 50 of a ferroelectric material 52, such as lead germanium oxide ($Pb_5Ge_3O_{11}$) (PGO) layer on indium oxide layer 28 and between the barrier insulation sidewalls 46, using optimum process conditions, to be described later herein. The PGO layer is smoothed by CMP and annealed as part of the selective deposition step, and a top electrode 54 is deposited 56 to a thickness of between about 20 nm to 300 nm. Top electrode 54 may be formed of conductive material, such as platinum, iridium, aluminum, AlCu, rhodium, titanium, TiN, tantalum, TaN, etc. Top electrode 54 is patterned and etched 58.

Figure 6:
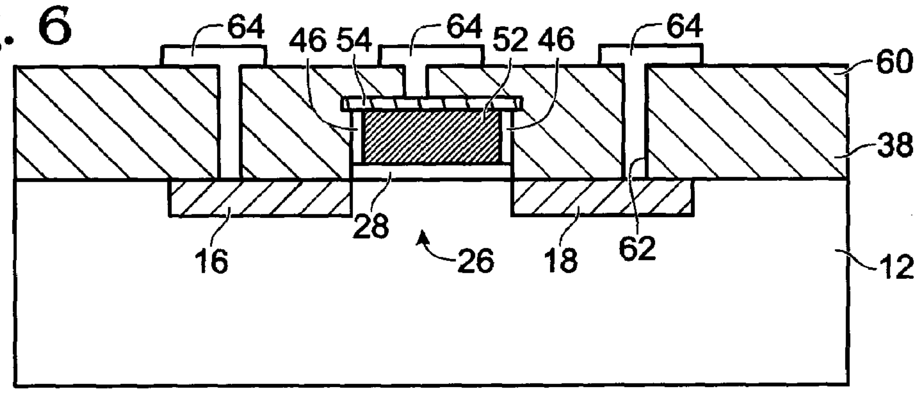
Figure 7:
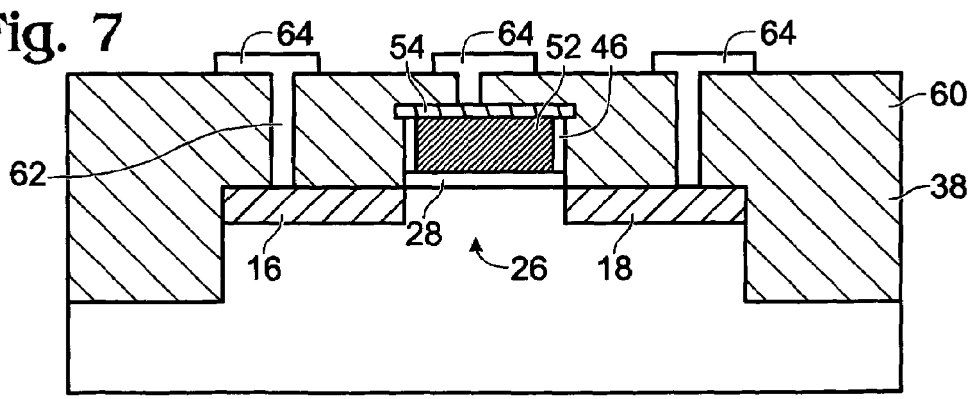
FIG. 7 depicts a MFMox memory transistor without a bottom electrode constructed according to the method of the invention.

As shown in FIG. 6, about 400 nm of oxide 60 is deposited, contact holes 62 are formed by etching, and the structure is metallized 64 to form a MFMox device structure, referred to herein as completing the memory transistor, 66, resulting in the structure shown in FIG. 7.

Figure 8:
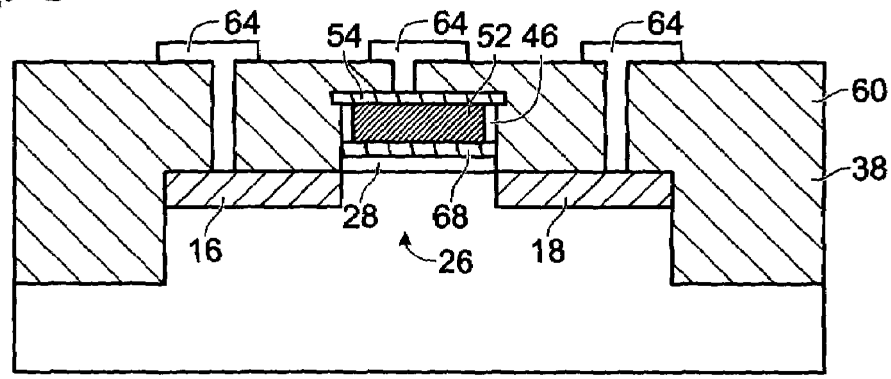
FIG. 8 depicts a MFMMox memory transistor having a bottom electrode constructed according to the method of the invention.

Referring to FIG. 8, the fabrication process of a semiconductive metal oxide channel ferroelectric memory transistor having a bottom electrode, in a second embodiment of a device constructed according to the method of the invention, is the same as that described above except that a bottom electrode is formed, in the preferred embodiment, in the form of a thin layer of iridium 68, which is deposited 70 on titanium layer 28 prior to patterning the bottom electrode, which then requires that the iridium layer be patterned and etched, along with the titanium and indium oxide layers. The remaining fabrication processes steps are identical to that described above, resulting in the structure shown in FIG. 8, which has bottom electrode 68 located therein. As shown in the drawings and as described in this Specification, the description includes all steps of the best mode of practicing the invention. There are no additional steps, and the various layers, as described, are formed and/or deposited in sequence without any intervening steps or layers.

For the device structures shown in FIGS. 7 and 8, the indium oxide thin film deposition and annealing processes comprise critical issues required for the integration process of the method of the invention. In order to make high quality 1T MFMox and MFMMox memory devices, the resistance of indium oxide must be controlled to be in a predetermined range. The resistance of the indium oxide channel is a function of the resistivity of indium oxide material, channel length and the width and thickness of indium oxide thin films and the interface between indium oxide and silicon.

Experimental results demonstrate the high quality of devices fabricated using sputtering deposition processes to form indium oxide thin films: P type silicon (100) wafers are used as the substrates for indium oxide thin film deposition. In the case where indium oxide is deposited on silicon, the silicon wafer is dipped in HF (50:1) for about 5 seconds before indium oxide deposition, by DC sputtering, in the preferred embodiment. The sputtering parameters, using an indium target are: DC sputtering power: between about 200 W to 300 W; oxygen partial pressures: between about 20% to 60%; substrate temperature: between about 100° C. to 200° C.; and post-annealing temperature: between about 400° C. to 800° C., for between about five minutes to two hours.

Figure 9:
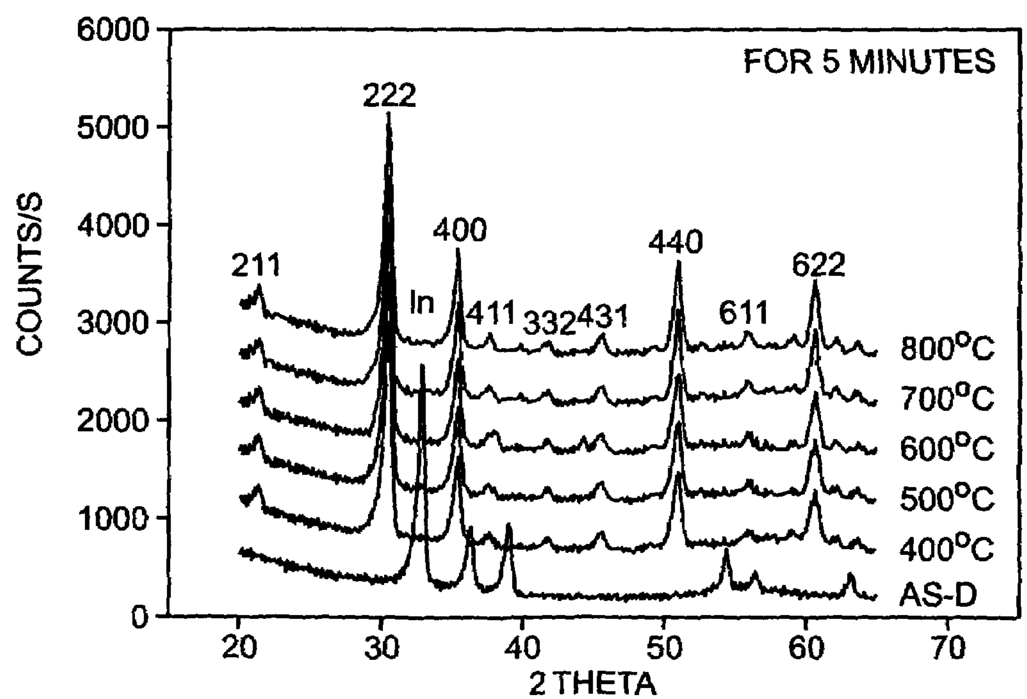
FIG. 9 depicts an x-ray pattern of $In_2O_3$ thin films annealed at various temperatures.
Figure 10:
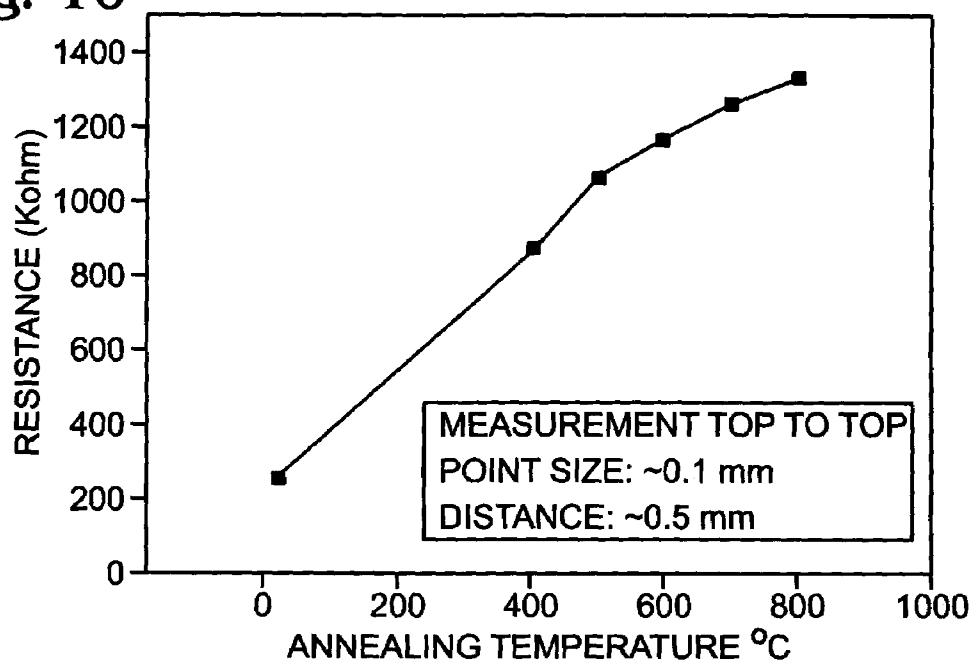
FIG. 10 depicts the resistance of $In_2O_3$ thin film annealed at various temperatures.

FIG. 9 depicts the x-ray patterns of as-deposited $In_2O_3$ thin film formed on a silicon substrate and annealed at between about 400° C. to 800° C., which demonstrates that $In_2O_3$ thin film deposited on a silicon substrate is stable up to about 800° C. FIG. 10 depicts the resistance of $In_2O_3$ thin film annealed at various temperatures, which demonstrates that the resistance of $In_2O_3$ thin film deposited on a silicon substrate increases with increasing annealing temperatures. It is shown that the best properties of both 1T MFMox and MFMMox devices are obtained with an $In_2O_3$ annealing temperature of between about 400° C. to 800° C., and wherein the thickness of the $In_2O_3$ thin film is between about 10 nm to 100 nm.

Another critical parameter is selective deposition of a PGO thin film. For a 1T MFMox device, not having a bottom electrode, the optimum selective deposition conditions are as follows: [Pb(thd)$_2$] and [Ge(ETO)$_4$] precursors, having a molar ratio of between about 5:3 to 5.5:3 are dissolved in a mixed solvent of butyl ether or tetrahydrofuran, isopropanol and tetraglyme in a molar ratio of 8:2:1, resulting in a precursor solution having a concentration of about 0.1 M/L of PGO. The solution is injected into a vaporizer at temperature in the range of between about 180° C. to 240° C. by a pump at a rate of between about 0.02 ml/min to 0.2 ml/min to form precursor gases, and the feed line temperature maintained at between about 180° C. to 245° C. The substrate of $In_2O_3$/silicon is cleaned with $H_2O_2$+5% $NH_4OH$; the deposition temperatures is maintained at between about 500° C. to 540° C., at a deposition pressure of between about 1 torr to 10 torr; oxygen partial pressure is held at between about 30% to 50%; vaporizer temperature is between about 180° C. to 200° C.; vaporizer pressure is between about 30 torr to 50 torr; solution delivery rate is between about 0.02 ml/min to 0.2 ml/min; and the deposition time is between about one to two hours, depending on the desired film thickness. The annealing temperature for PGO annealing is between about 500° C. to 560° C. for between about five minutes to thirty minutes in an oxygen ambient atmosphere. After the PGO is smoothed by CMP, the thin film is again annealed at a temperature of between about 500° C. to 560° C. for between about five minutes to ten minutes in an oxygen ambient atmosphere.

As used herein, "optimum PGO selective deposition conditions" are, in the preferred embodiment: a precursor formed of [Pb(thd)$_2$] and [Ge(ETO)$_4$], having a molar ratio of between about 5:3 to 5.5:3, dissolved in a mixed solvent of butyl ether or tetrahydrofuran, isopropanol and tetraglyme in a molar ratio of 8:2:1. The precursor solutions have a concentration of about 0.1 M/L of PGO. The precursor solution is injected into a vaporizer at a temperature in the range of between about 180° C. to 240° C. by a pump at a rate of between about 0.02 ml/min to 0.2 ml/min, to form a precursor gas. The feed line is maintained at a temperature of between about 180° C. to 245° C.

A two step deposition process is used. The first step of the deposition process provides selective deposition of a PGO seed layer on an iridium layer (the bottom electrode), including cleaning the iridium surface by a dip in 50:1 HF; deposition of PGO at a temperature of between about 500° C. to 540° C.; at a pressure of between about 1 torr to 5 torr; at an oxygen partial pressure of between about 20% to 30%;

at a vaporizer temperature of between about 180° C. to 200° C.; with a solution delivery rate of between about 0.05 ml/min to 0.1 ml/min; and a deposition time of between about five minutes to twenty minutes.

The second step of the deposition process provides for selective deposition conditions for PGO deposited on an iridium and platinum bottom electrode. The deposition temperatures is maintained between about 380° C. to 420° C. at a pressure of between about 5 torr and 10 torr. The oxygen partial pressures is between about 30% to 40%; the vaporizer temperature is between about 200° C. to 240° C.; the solution delivery rate is between about 0.1 ml/min to 0.2 ml/min; the deposition time is between about one hour to three hours, depending on the desired film thickness. A post-deposition annealing temperature is between about 520° C. to 560° C. for between about thirty minutes to one hour in an oxygen ambient atmosphere.

Figure 11:
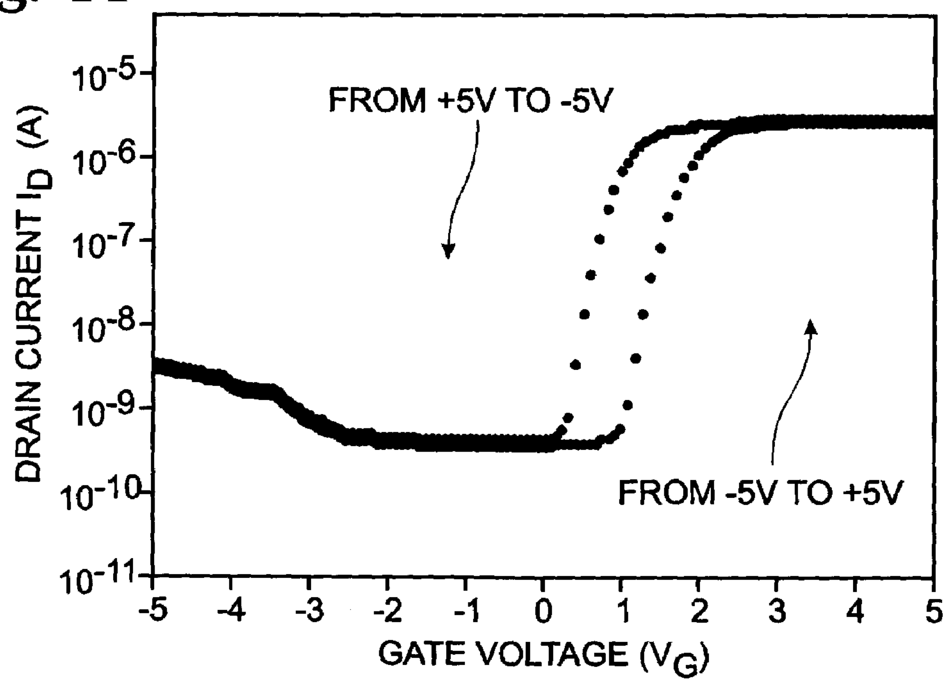
FIG. 11 is a ID-VG curve of a 1T MFMox memory device.

FIG. 11 shows the properties of 1 T MFMox memory transistor device. A MFMox memory transistor device, having dimensions of 3 μm×10 μm, demonstrates a memory window of about 0.8 V. The off-state current, at a $V_D$ of 0.1 V, is about $5\times10^{-10}$ A, while the on-state current at a $V_D$ of 0.1 V is about $7\times10^{-6}$ A.

Figure 12:
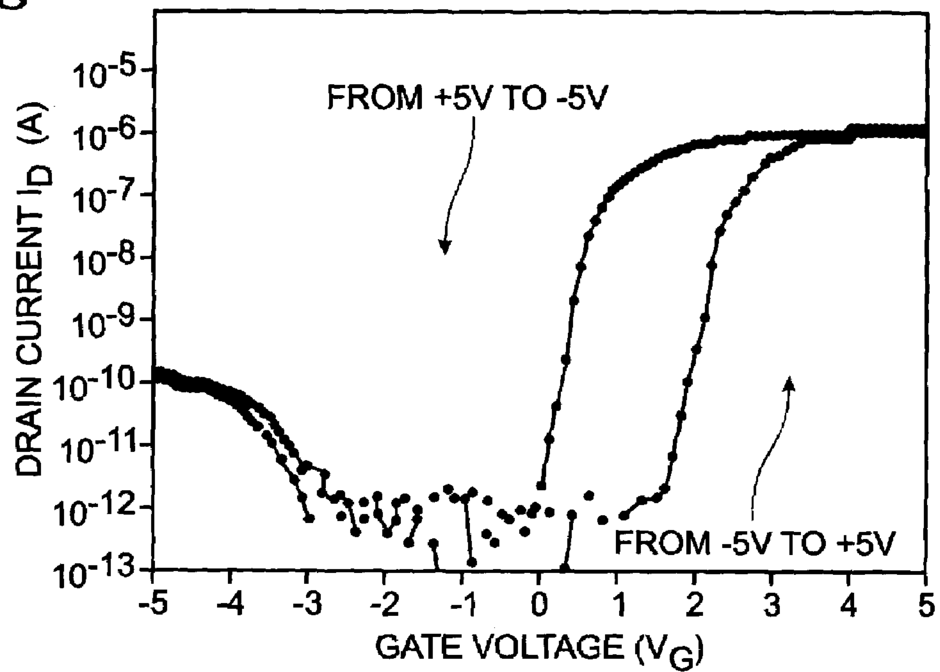
FIG. 12 is an X-ray pattern of lead germanium oxide ($Pb_5Ge_3O_{11}$) (PGO) thin films deposited on $In_2O_3$ and iridium substrates.

Compared with PGO thin films deposited on iridium substrate, the c-axis orientation of PGO thin films deposited on $In_2O_3$ thin films is much lower, as shown in FIG. 12. Therefore, 1T MFMMox memory devices exhibit superior properties, as shown in FIG. 12. A MFMMox memory transistor device, of size 0.6 μm×10 μm, exhibits a memory window of about 1.5 V. The off-state current at $V_D$ of 0.1 V is about $1\times10^{-12}$ A and the on-state current at $V_D$ of 0.1 V is about $1\times10^{-6}$ A. A MFMMox memory transistor device, having a size of 10 μm×10 μm, exhibits a memory window of about 2 V. The off-state current at $V_D$ of 0.1 V is about $1\times10^{-12}$ A and the on-state current at $V_D$ of 0.1 V is about $1\times10^{-6}$ A.

Figure 13:
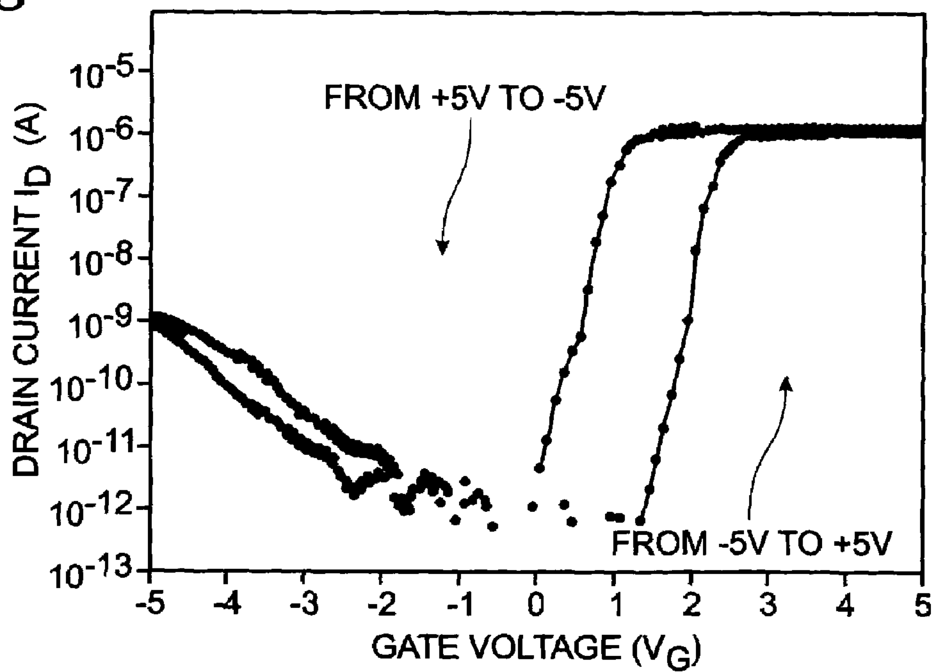
FIG. 13 depicts properties of a 0.6 μm×10 μm 1T MFMMox memory transistor constructed according to the method of the invention.
Figure 14:
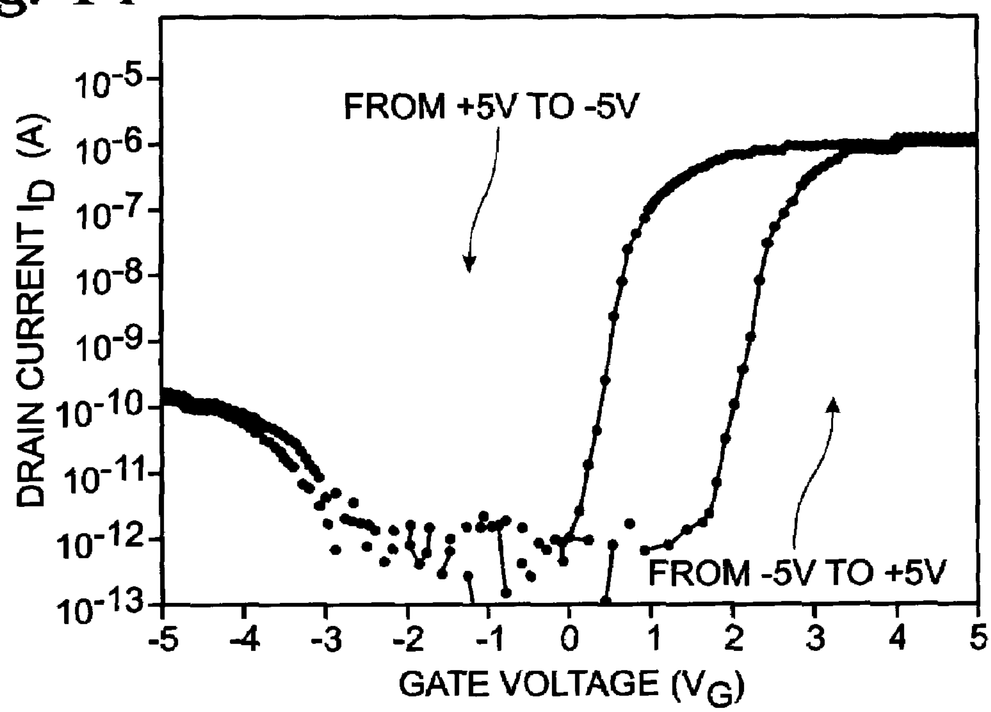
FIG. 14 depicts properties of a 10 μm×10 μm 1T MFMMox memory transistor constructed according to the method of the invention.

FIG. 13 depicts the properties of a 1T MFMMox memory transistor device having a device size 0.6 μm×10 μm, while FIG. 14 depicts the properties of a 1T MFMMox memory transistor device having a device size 10 μm×10 μm.

Thus, integration processes for fabricating a conductive metal oxide gate ferroelectric memory transistor have been disclosed. It will be appreciated that further variations and modifications thereof may be made within the scope of the invention as defined in the appended claims.

The invention claimed is:

1. A method of fabricating a conductive metal oxide gate ferroelectric memory transistor comprising:

preparing a substrate;

forming an oxide layer on the substrate;

removing the oxide layer in a gate area to expose a gate area;

depositing an indium oxide layer on the oxide layer and on the exposed gate area to a thickness of between about 10 nm to 100 nm by DC sputtering using an indium target at a DC sputtering power of between about 200 W to 300 W, at an oxygen partial pressure of between about 20% to 60%, at a substrate temperature of between about 100° C. to 200° C., and annealing the substrate and indium oxide layer at a temperature of between about 400° C. to 800° C. for between about five minutes to two hours;

depositing a titanium layer on the indium oxide layer;

patterning and etching the titanium layer and the indium oxide layer to remove the titanium layer and the indium oxide layer from the substrate except in the gate area;

depositing, patterning and etching an oxide layer to form a gate trench;

depositing and etching a barrier insulator layer to form a sidewall barrier in the gate trench;

removing the titanium layer from the gate area;

depositing, smoothing and annealing a ferroelectric layer in the gate trench;

depositing a top electrode;

patterning and etching the top electrode; and completing the conductive metal oxide gate ferroelectric memory transistor.

2. The method of claim 1 wherein said depositing, smoothing and annealing a ferroelectric layer in the gate trench includes depositing, smoothing and annealing a layer of PGO by forming a PGO precursor of $[Pb(thd)_2]$ and $[Ge(ETO)_4]$, having a molar ratio of between about 5:3 to 5.5:3, dissolved in a mixed solvent taken from the group of solvents consisting of butyl ether and tetrahydrofuran, isopropanol and tetraglyme, in a molar ratio of 8:2:1, having a PGO concentration of about 0.1 M/L; injecting the PGO precursor into a vaporizer at a temperature in the range of between about 180° C. to 240° C. by a pump at a rate of between about 0.02 ml/min to 0.2 ml/min, to form a precursor gas; and maintaining a feed line at a temperature of between about 180° C. to 245° C.

3. The method of claim 2 wherein said depositing, smoothing and annealing a ferroelectric layer in the gate trench is a two step process, wherein a first step of the deposition process provides selective deposition of a PGO seed layer on an iridium bottom electrode layer, including cleaning the iridium surface by a dip in 50:1 HF; deposition of PGO at a temperature of between about 500° C. to 540° C.; at a pressure of between about 1 torr to 5 torr; at an oxygen partial pressure of between about 20% to 30%; at a vaporizer temperature of between about 180° C. to 200° C.; with a solution delivery rate of between about 0.05 ml/min to 0.1 ml/min; and a deposition time of between about five minutes to twenty minutes.

4. The method of claim 3 wherein a second step of the deposition process is performed at a deposition temperature of between about 380° C. to 420° C. at a pressure of between about 5 torr and 10 torr; at an oxygen partial pressure of between about 30% to 40%; at a vaporizer temperature of between about 200° C. to 240° C.; at a solution delivery rate of between about 0.1 ml/min to 0.2 ml/min; for a deposition time of between about one hour to three hours; and at an annealing temperature of between about 520° C. to 560° C. for between about thirty minutes to one hour in an oxygen ambient atmosphere.

5. The method of claim 1 which includes, after said depositing a titanium layer on the indium oxide layer, depositing, patterning and etching a bottom electrode on the titanium layer.

6. The method of claim 5 wherein said depositing, patterning and etching a bottom electrode on the titanium layer includes depositing a layer of material taken from the group of materials consisting of Ir, Pt, Rh, Ti, TiN, Ta, TaN, and multi-layer structures of these metals; and wherein said patterning and etching the titanium layer and the indium oxide layer to remove the titanium layer and the indium oxide layer from the substrate except in the gate area includes patterning the bottom electrode material.

7. A method of fabricating a conductive metal oxide gate ferroelectric memory transistor comprising:

preparing a substrate;

forming an oxide layer on the substrate;

removing the oxide layer in a gate area to expose a gate area;

depositing an indium oxide layer on the oxide layer and on the exposed gate area;

depositing a titanium layer on the indium oxide layer;

patterning and etching the titanium layer and the indium oxide layer to remove the titanium layer and the indium oxide layer from the substrate except in the gate area;

depositing, patterning and etching an oxide layer to form a gate trench;

depositing and etching a barrier insulator layer to form a sidewall barrier in the gate trench;

removing the titanium layer from the gate area;

depositing, smoothing and annealing a layer of PGO in the gate trench by forming a PGO precursor of [Pb $(thd)_2$] and $[Ge(ETO)_4]$, having a molar ratio of between about 5:3 to 5.5:3, dissolved in a mixed solvent taken from the group of solvents consisting of butyl ether and tetrahydrofuran, isopropanol and tetraglyme, in a molar ratio of 8:2:1, having a PGO concentration of about 0.1 M/L; injecting the PGO precursor into a vaporizer at a temperature in a range of between about 180° C. to 240° C. by a pump at a rate of between about 0.02 ml/min to 0.2 ml/min, to form a precursor gas; maintaining a feed line at a temperature of between about 180° C. to 245° C.;

depositing a top electrode;

patterning and etching the top electrode; and completing the conductive metal oxide gate ferroelectric memory transistor.

8. The method of claim 7 wherein said depositing, smoothing and annealing a ferroelectric layer in the gate trench is a two step process, wherein a first step of the deposition process provides selective deposition of a PGO seed layer on an iridium bottom electrode layer, including cleaning the iridium surface by a dip in 50:1 HF; deposition of PGO at a temperature of between about 500° C. to 540° C.; at a pressure of between about 1 torr to 5 torr; at an oxygen partial pressure of between about 20% to 30%; at a vaporizer temperature of between about 180° C. to 200° C.; with a solution delivery rate of between about 0.05 ml/min to 0.1 ml/min; and a deposition time of between about five minutes to twenty minutes.

9. The method of claim 8 wherein a second step of the deposition process is performed at a deposition temperature of between about 380° C. to 420° C. at a pressure of between about 5 torr and 10 torr; at an oxygen partial pressure of between about 30% to 40%; at a vaporizer temperature of between about 200° C. to 240° C.; at a solution delivery rate of between about 0.1 ml/min to 0.2 ml/min; for a deposition time of between about one hour to three hours; and at an annealing temperature of between about 520° C. to 560° C. for between about thirty minutes to one hour in an oxygen ambient atmosphere.

10. The method of claim 7 wherein said depositing an indium oxide layer on the oxide layer and on the exposed gate area includes depositing a layer of indium oxide to a thickness of between about 10 nm to 100 nm by DC sputtering using an indium target at a DC sputtering power of between about 200 W to 300 W, at an oxygen partial pressure of between about 20% to 60%, at a substrate temperature of between about 100° C. to 200° C., and annealing the substrate and indium oxide layer at a temperature of between about 400° C. to 800° C. for between about five minutes to two hours.

11. The method of claim 7 which includes, after said depositing a titanium layer on the indium oxide layer, depositing, patterning and etching a bottom electrode on the titanium layer.

12. The method of claim 11 wherein said depositing, patterning and etching a bottom electrode on the titanium layer includes depositing a layer of material taken from the group of materials consisting of Ir, Pt, Rh, Ti, TiN, Ta, TaN, and multi-layer structures of these metals; and wherein said patterning and etching the titanium layer and the indium oxide layer to remove the titanium layer and the indium oxide layer from the substrate except in the gate area includes patterning the bottom electrode material.

13. A method of fabricating a conductive metal oxide gate ferroelectric memory transistor comprising:

preparing a substrate;

forming an oxide layer on the substrate;

removing the oxide layer in a gate area to expose a gate area;

depositing a layer of conductive metal oxide on the oxide layer and on the exposed gate area;

depositing a titanium layer on the conductive metal oxide layer;

patterning and etching the titanium layer and the metal oxide layer to remove the titanium layer and the conductive metal oxide layer from the substrate except in the gate area;

depositing, patterning and etching an oxide layer to form a gate trench;

depositing and etching a barrier insulator layer to form a sidewall barrier in the gate trench;

removing the titanium layer from the gate area;

depositing, smoothing and annealing a layer of PGO in the gate trench by forming a PGO precursor of [Pb $(thd)_2$] and $[Ge(ETO)_4]$, having a molar ratio of between about 5:3 to 5.5:3, dissolved in a mixed solvent taken from the group of solvents consisting of butyl ether and tetrahydrofuran, isopropanol and tetraglyme, in a molar ratio of 8:2:1, having a PGO concentration of about 0.1 M/L; injecting the PGO precursor into a vaporizer at a temperature in the range of between about 180° C. to 240° C. by a pump at a rate of between about 0.02 ml/min to 0.2 ml/min, to form a precursor gas; maintaining a feed line at a temperature of between about 180° C. to 245° C.;

depositing a top electrode;

patterning and etching the top electrode; and completing the conductive metal oxide gate ferroelectric memory transistor.

14. The method of claim 13 wherein said depositing, smoothing and annealing a ferroelectric layer in the gate trench is a two step process, wherein a first step of the deposition process provides selective deposition of a PGO seed layer on an iridium bottom electrode layer, including cleaning the iridium surface by a dip in 50:1 HF; deposition of PGO at a temperature of between about 500° C. to 540° C.; at a pressure of between about 1 torr to 5 torr; at an oxygen partial pressure of between about 20% to 30%; at a vaporizer temperature of between about 180° C. to 200° C.; with a solution delivery rate of between about 0.05 ml/min to 0.1 ml/min; and a deposition time of between about five minutes to twenty minutes.

15. The method of claim 14 wherein a second step of the deposition process is performed at a deposition temperature of between about 380° C. to 420° C. at a pressure of between about 5 torr and 10 torr; at an oxygen partial pressure of between about 30% to 40%; at a vaporizer temperature of between about 200° C. to 240° C.; at a solution delivery rate of between about 0.1 ml/min to 0.2 ml/min; for a deposition time of between about one hour to three hours; and at an annealing temperature of between about 520° C. to 560° C. for between about thirty minutes to one hour in an oxygen ambient atmosphere.

16. The method of claim 13 which includes, after said depositing a titanium layer on the conductive metal oxide layer, depositing, patterning and etching a bottom electrode on the titanium layer.

17. The method of claim 16 wherein said depositing, patterning and etching a bottom electrode on the titanium layer includes depositing a layer of material taken from the group of materials consisting of Ir, Pt, Rh, Ti, TiN, Ta, TaN, and multi-layer structures of these metals; and wherein said patterning and etching the titanium layer and the metal oxide layer to remove the titanium layer and the conductive metal oxide layer from the substrate except in the gate area includes patterning the bottom electrode material.

18. The method of claim 13 wherein said depositing a layer of conductive metal oxide on the substrate includes depositing a layer of conductive metal oxide taken from the group of metal oxides consisting of indium tin oxide (ITO), $RuO_2$ and $La_{1-x}Sr_xCoO_3$, to a thickness of between about 10 nm to 100 nm by DC sputtering using an metal oxide target at a DC sputtering power of between about 200 W to 300 W, at an oxygen partial pressure of between about 20% to 60%, at a substrate temperature of between about 100° C. to 200° C., and annealing the substrate and metal oxide layer at a temperature of between about 400° C. to 800° C. for between about five minutes to two hours.

* * * * *